United States Patent
Hibino et al.

(10) Patent No.: US 6,529,251 B2
(45) Date of Patent: *Mar. 4, 2003

(54) LIQUID CRYSTAL DISPLAY DEVICE AND METHOD OF MANUFACTURING THE SAME

(75) Inventors: Yoshitaka Hibino, Matsusaka (JP); Tetsuya Tarui, Osaka (JP); Toshihiko Hirobe, Sakai (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/505,858

(22) Filed: Feb. 17, 2000

(65) Prior Publication Data

US 2002/0126243 A1 Sep. 12, 2002

(30) Foreign Application Priority Data

Feb. 23, 1999 (JP) ............................................ 11-044239

(51) Int. Cl.⁷ ........................ G02F 1/136; G02F 1/1333; H01L 29/04
(52) U.S. Cl. ............................. 349/42; 349/43; 349/46; 349/47; 349/122; 349/138; 257/59; 257/72
(58) Field of Search ............................ 349/42, 43, 46, 349/47, 138, 122; 257/59, 72, 764

(56) References Cited

U.S. PATENT DOCUMENTS

| | | | |
|---|---|---|---|
| 5,327,001 A | * 7/1994 | Wakai et al. | 257/350 |
| 5,585,951 A | 12/1996 | Noda et al. | 349/122 |
| 5,650,664 A | * 7/1997 | Sakamoto | 257/764 |
| 5,905,548 A | * 5/1999 | Shimada | 349/38 |
| 5,990,542 A | * 11/1999 | Yamazaki | 257/642 |
| 6,031,290 A | * 2/2000 | Miyazaki et al. | 257/764 |
| 6,051,883 A | * 4/2000 | Nakamura | 257/68 |

FOREIGN PATENT DOCUMENTS

| | | | |
|---|---|---|---|
| JP | 61-144872 A | * | 7/1986 |
| JP | 3-9435 | | 1/1991 |
| JP | 03-036736 A | * | 2/1991 |
| JP | 03-122620 A | * | 5/1991 |
| JP | 3-209435 | | 9/1991 |
| JP | 04-163528 | | 6/1992 |
| JP | 04-278928 A | * | 10/1992 |
| JP | 06-120355 A | * | 4/1994 |
| JP | 06-148683 | | 5/1994 |
| JP | 07-169967 | | 7/1995 |
| JP | 07-318975 | | 12/1995 |
| JP | 09-307113 A | * | 11/1997 |
| JP | 10-27910 | | 1/1998 |
| JP | 10-020342 | | 1/1998 |
| JP | 10-170951 | | 6/1998 |
| JP | 10-197891 | | 7/1998 |
| JP | 10-253976 | | 9/1998 |
| JP | 11-103069 A | * | 4/1999 |
| KR | 98-87264 | | 12/1998 |

* cited by examiner

Primary Examiner—William L. Sikes
Assistant Examiner—Tarifur R. Chowdhury
(74) Attorney, Agent, or Firm—Nixon & Vanderhye P.C.

(57) ABSTRACT

A liquid crystal display device includes: a source electrode (gate electrode) having an Al or Al alloy layer; a pixel electrode provided above the source electrode (gate electrode); and interlayer insulator films interposed between the source electrode (gate electrode) and the pixel electrode by depositing a TFT protection film as an inorganic insulator film and an organic insulator film in this sequence when viewed from the source electrode, so as to cover the source electrode (gate electrode).

15 Claims, 8 Drawing Sheets

(PRIOR ART)

LIQUID CRYSTAL DISPLAY DEVICE AND METHOD OF MANUFACTURING THE SAME

FIELD OF THE INVENTION

The present invention relates to liquid crystal display devices with TFTs (Thin Film Transistors) and methods of manufacturing the same.

BACKGROUND OF THE INVENTION

Conventionally, TFT liquid crystal display devices are widely used to display high quality images. The following description will discuss a method of manufacturing a semiconductor substrate in such liquid crystal display devices.

The basic structure of the TFT included in such liquid crystal display devices is of a reverse stagger type; therefore, the gate electrode provided in the bottom layer is preferably made of a metal that can be selective etched. Here, the description will be based on an assumption that a Ta metal film is used as a material for the gate electrode as illustrated in FIG. 6(a) and FIG. 8(b).

First, as shown in FIG. 6(a), a gate electrode 52 composed of a Ta metal film is deposited on a glass substrate 51 using a PVD technique (Physical Vapor Deposition technique, which is a sputtering technique).

Next, as shown in FIG. 6(b), a resist 53 is deposited on the gate electrode 52 and patterned as required for the gate electrode 52 using a photolithography technique.

Then, as shown in FIG. 6(c), the gate electrode 52 is fabricated into a predetermined electrode pattern using a PE (Plasma Etching) technique, a RIE (Reactive Ion Etching) technique, or a wet etching technique, and the resist 53 is removed.

Then, as shown in FIG. 6(d), a GI (Gate Insulator) film 54 (typically composed of $SiN_x$), an I—Si film 55, and a n+ film 56 are successively formed, typically, using a PE-CVD technique (Plasma-Enhanced Chemical Vapor Deposition technique).

After forming these three films, similarly to the patterning of the gate electrode 52, the I—Si film 55 and the $n^+$ film 56 that constitute a channel layer are fabricated like an island as shown in FIG. 7(a) using a photolithography technique as well as a PE (plasma etching) technique, an RIE (Reactive Ion Etching) technique, or a wet etching technique so as to form a semiconductor layer.

Thereafter, a resist (not shown) is applied on the gate insulator film 54 according to a pattern, and the gate insulator film 54 is etched above the connecting terminal section of the gate electrode 52. Typically, the gate electrode 52 serves as the connecting terminal.

Subsequently, as shown in FIG. 7(b), a source electrode 57 (source and drain electrodes in the strict sense of the terms; however since the drain electrode is formed simultaneously with the source electrode, they may be collectively referred to as the source electrode) of Ti, Al, W, Ta, etc. is deposited using a PVD technique, and patterned using the same method as that used to form the gate electrode 52.

Subsequently, using the same source mask as that used in the patterning of the source electrode 57, the $n^+$ film 56 is etched off the channel section to form a TFT (Thin Film Transistor) 58 (see FIG. 7(c)).

Thereafter, a pixel electrode 59 composed of a transmissive conductive film (typically, an ITO film) is deposited using a PVD technique as shown in FIG. 7(d), and fabricated into a predetermined electrode pattern using a wet etching technique as shown in FIG. 8(a).

Lastly, as shown in FIG. 8(b), a TFT protection film 60 is formed using a PE-CVD technique, completing the manufacturing process of a TFT array substrate.

Incidentally, in recent years, a low resistance metal, such as Al, an Al alloy, or Cu, is used to constitute electrodes in a high precision liquid crystal display panel (see Japanese Laid-Open Patent Application No. 6-148683/1994 (Tokukaihei 6-148683: laid-open on May 27, 1994), Japanese Laid-Open Patent Application No. 7-169967/1995 (Tokukaihei 7-169967: laid-open on Jul. 4, 1995), and Japanese Laid-Open Patent Application No. 10-253976/1998 (Tokukaihei 10-253976: laid-open on Sep. 25, 1998) for examples). However, if, for example, the gate electrode 52 is composed of the foregoing Al material instead of Ta, and the source electrode 57 is composed of an Al material, a defect in the gate insulator film 54 causes the gate electrode 52, which lies beneath the source electrode 57, to erode during the etching of the source electrode 57.

A further problem arises during the wet etching of the ITO film, which is the last step, that the gate electrode 52, as well as the source electrode 57, erodes because of the use of HCl, HBr, or other strong acids, unless a sufficiently thick insulator film (for example, the gate insulator film 54) is provided.

Nonetheless, it is difficult to form a thick inorganic insulator film, because its formation and etching steps are time-consuming and an undesirable electrostatic capacity is created between those electrodes provided above and below the thickened insulator film.

Japanese Laid-Open Patent Application No. 4-163528/1992 (Tokukaihei 4-163528: laid-open on Jun. 9, 1992) discloses a technology to protect the pixel electrode from peeling during patterning by depositing the pixel electrode over two interlayer insulator films. The interlayer insulator films in such a configuration have a double-layered structure constituted by an organic insulator film and an inorganic insulator film that is formed on the organic insulator film.

Therefore, in the etching process of the interlayer insulator films, the inorganic film is subjected to dry etching (the total thickness of the film is 3.13 $\mu$m), which is followed by etching of the organic film. Here, the organic film is thick and inevitably needs to be etched using a liquid agent. A problem arises, however, that acid and alkaline solutions and other liquid agents that erode the Al material constituting the Al electrode can not be used in the treatment of the organic film. Another problem is that the organic film is more likely to cause source-to-drain leakage than the inorganic film.

The aforementioned problems of the source electrode 57 and the gate electrode 52 composed of Al materials are summed up as below:

(1) A defect in the gate insulator film 54 causes the gate electrode 52 and the terminal section formed from the gate electrode 52 to be etched during the patterning of the source electrode 57.

(2) During the patterning of the pixel electrode 59 composed of an ITO film, the source electrode 57 and the gate electrode 52 erode, as the strong acid liquid, such as HCl used for the etching of the pixel electrode 59 seeps through defects in the gate insulator film 54. A possible solution that would offer protection to the Al electrode from erosion is to modify the foregoing manufacturing process so as to form an ITO film on the TFT protection film; however, a simple change in the process could not give satisfactory results in protecting the Al electrode from erosion.

(3) If the pixel electrode is deposited over an interlayer insulator film having a double-layered structure constituted by an organic insulator film and an inorganic insulator film that are sequentially deposited, available chemical agents are limited by the need to protect the Al material for the Al electrode from erosion during the etching of the thickened organic film.

Further, erosion of the foregoing Al electrodes, i.e., the source electrode 57 and the gate electrode 52 reduces the output of good quality liquid crystal display devices, and accordingly adds to the manufacturing cost.

SUMMARY OF THE INVENTION

The present invention has objects to offer a liquid crystal display device that is capable of preventing erosion of an Al material of which the source or gate electrode of the liquid crystal display device is composed, and to offer a method of manufacturing such a liquid crystal display device.

In order to achieve the objects, a liquid crystal display device in accordance with the present invention includes:

a first electrode having an Al or Al alloy layer;

a pixel electrode provided above the first electrode, and at least two interlayer insulator layers interposed between the first electrode and the pixel electrode so as to cover the first electrode, and is characterized in that the two interlayer insulator layers include a first layer composed of an inorganic insulator film and a second layer composed of an organic insulator film, the first and second layers being provided in this sequence when viewed from the first electrode.

A method of manufacturing a liquid crystal display device in accordance with the present invention is characterized in that it includes the steps of:

providing a first electrode having an Al or Al alloy layer;

depositing at least a first layer composed of an inorganic insulator film and a second layer composed of an organic insulator film above the first electrode so as to provide at least two interlayer insulator layers that cover the first electrode, the first and second layers being provided in this sequence when viewed from the first electrode; and providing a pixel electrode above the interlayer insulator layers.

According to the arrangement, the pixel electrode is disposed at least above the two interlayer insulator layers formed by depositing the first layer composed of an inorganic insulator film and the second layer composed of an organic insulator film, the first and second layers being provided in this sequence when viewed from the first electrode. Therefore, for example, when the organic insulator film is etched using a weak alkaline solution, the inorganic insulator film provides protection to the underlying first electrode having an Al or Al alloy layer by preventing the etching liquid from reaching the first electrode. The first electrode is thus protected from erosion.

Moreover, one less photo masks are required in the patterning of the two interlayer insulator layers, by using the same pattern in the patterning of the organic insulator film (3 μm thick) in the photolithography step and in the following patterning of the inorganic insulator film (TFT protection film, 0.13 μm thick) by dry etching. The arrangement offers good selectivity that allows selective etching of the inorganic insulator film, while providing protection to the underlying first electrode having an Al or Al alloy layer.

Further, the arrangement allows the pixel electrode to be substantially separated by the interlayer insulator layers from the first electrode, for example, the source electrode or the gate electrode. Therefore, the arrangement successfully protects the Al or Al alloy layer in the first electrode from erosion during the etching of the pixel electrode despite a possible defect in either of the interlayer insulator layers. Leakage can be also prevented between the pixel electrode and the first electrode.

In the foregoing arrangement, the first layer composed of an inorganic insulator film is preferably provided directly on the first electrode (metal electrode) composed of an Al or Al alloy layer.

According to the arrangement, the first layer composed of an inorganic insulator film is formed directly on the first electrode (metal electrode) composed of an Al or Al alloy layer; therefore, the inorganic insulator film is formed with high quality, in comparison to a conventional arrangement including an inorganic insulator film formed on an organic insulator film. Further, the organic insulator film in the second layer can be formed on the inorganic insulator film in a satisfactory manner.

In other words, by forming the interlayer insulator films on the first electrode in the sequence as set forth in the present invention (an organic insulator film over an inorganic insulator film), the interlayer insulator films are formed with satisfactory quality. This results in less defects occurring in the interlayer insulator films, successfully preventing the etching liquid from reaching the metal electrode through the defects and thus protecting the metal electrode from erosion during the patterning of the pixel electrode.

Further, in the foregoing arrangement, preferably, the first layer composed of an inorganic insulator film is a TFT protection film.

According to the foregoing arrangement, the TFT protection film provided on the first electrode plays another role as an inorganic insulator film; this restrains increase in the number of interlayer insulator films, which otherwise would add to the complexity of the structure of the liquid crystal display device.

For a fuller understanding of the nature and advantages of the invention, reference should be made to the ensuing detailed description taken in conjunction with the accompanying drawings.

DESCRIPTION OF THE EMBODIMENT

Referring to FIG. 1 to FIG. 5, the following description will discuss an embodiment in accordance with the present invention.

Figure 1:
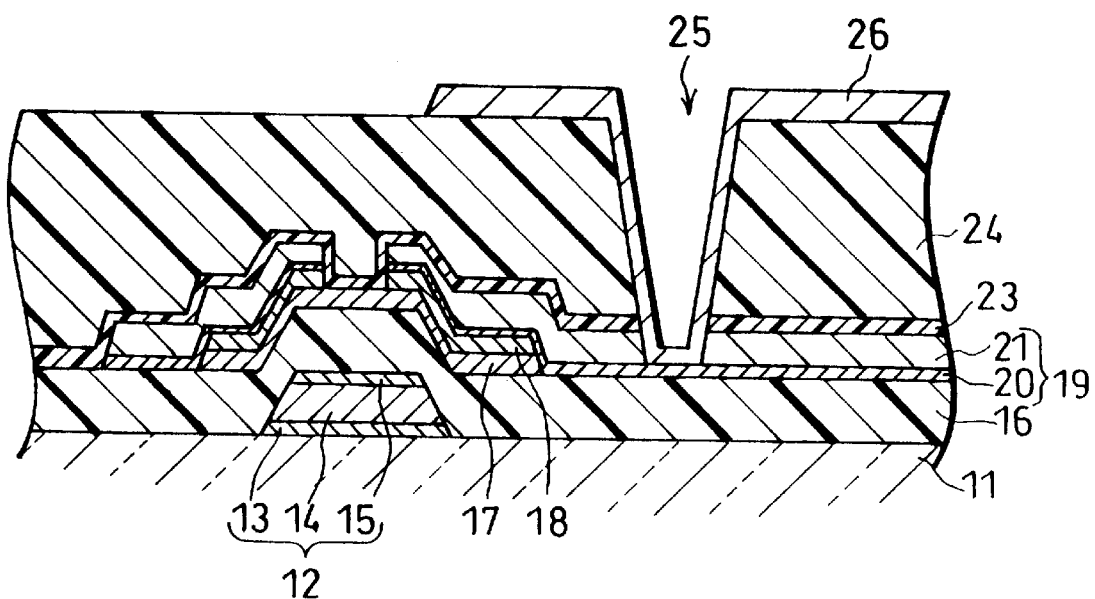
FIG. 1 is a vertical cross-sectional view showing an arrangement of a TFT array substrate of a liquid crystal display device, which is an embodiment in accordance with the present invention.

A liquid crystal display device, which is an embodiment in accordance with the present invention, includes a TFT array substrate arranged as shown in FIG. 1.

Specifically, a gate electrode (first electrode) 12 is formed in a three layer structure constituted by a Ti film 13, an Al film 14, and a TiN film 15 on a glass substrate 11. A gate insulator film 16 is formed on the gate electrode 12. An I—Si film 17 and an n+ film 18 are formed like an island on the gate insulator film 16. On the n+ film 18 there is provided a source electrode (first electrode) 19 composed of an TiN film (first source electrode layer) 20 and an Al film (second source electrode layer) 21. On the source electrode 19 there are provided a TFT protection film (interlayer insulator layer, inorganic insulator layer) 23, and an organic insulating film (interlayer insulator layer, organic insulator layer) 24. A pixel electrode 26 is formed on the organic insulating film 24.

A contact hole 25 is made through the organic insulating film 24. The TFT protection film 23 and the Al film 21 in the source electrode 19 are etched through the contact hole 25.

The Al film 14 in the gate electrode 12 and the Al film 21 in the source electrode 19 may be Al alloy films. The thicknesses of the Al film 14 and the Al film 21 are set according to the size of a panel of the liquid crystal display device.

The Ti film 13 and the TiN film 15 in the gate electrode 12 and the TiN film 20 in the source electrode 19 may be replaced with Ta, Ti, Cr, Mo, TiN, or MoN films which are appropriately chosen. All these films are made of a metal with a high melting point of 2000° C. or even higher.

The TFT protection film 23 is an inorganic insulator film composed of, for example, $SiN_x$ or $SiO_2$. The organic insulator film 24 is composed of, for example, an acrylic resin.

Figure 2A:
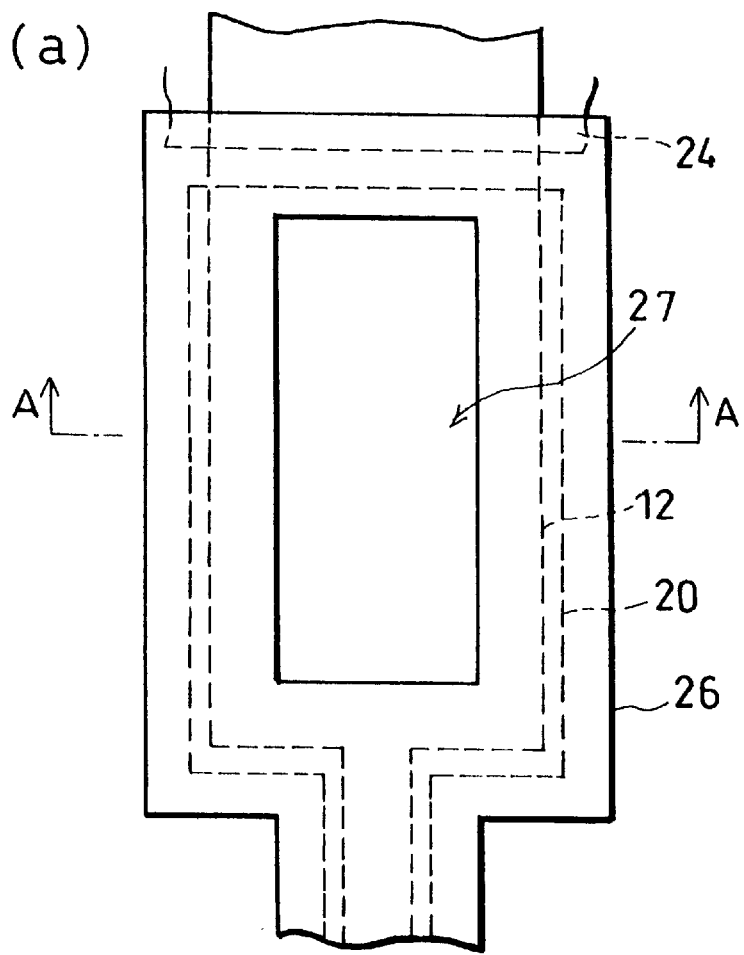
FIG. 2(a) is a plan view showing a terminal section of the TFT array substrate shown in FIG. 1.
Figure 2B:
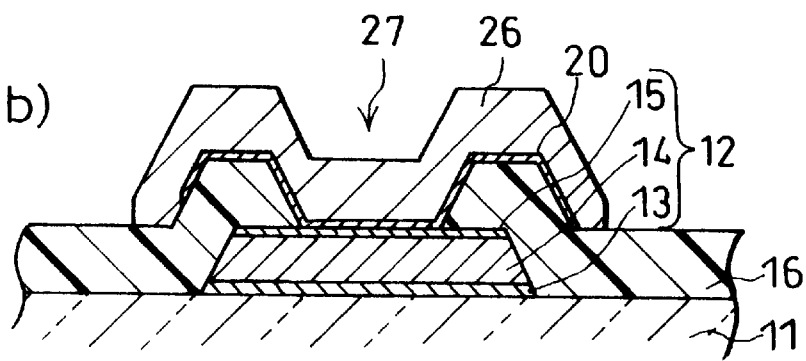
FIG. 2(b) is a cross-sectional view taken along line A—A shown in FIG. 2(a).

Further, a terminal section is arranged as shown in its plan view constituting FIG. 2(a) and its cross-sectional view constituting FIG. 2(b), the cross-sectional sectional view being taken along line A—A shown in FIG. 2(a).

Specifically, the gate electrode 12 that serves as an electrode for the terminal section is formed on the glass substrate 11. The gate electrode 12 is covered with the pixel electrode 26 and the TiN film 20 in the source electrode 19. A contact hole 27 is formed in the central part of the terminal section above the gate electrode 12. The gate insulator film 16 is etched through the contact hole 27. As a result, the top surface of the gate electrode 12 is covered with the pixel electrode 26 interposed by the source electrode 19 (TiN film 20).

Manufacturing a liquid crystal display device with a high precision display capability requires Al or an Al alloy, low resistance electrode material (a material for the gate electrode 12 and the source electrode 19). However, a compression or expansion force is exerted on the Al electrode due to thermal stress, which is a likely cause for hillocks, voids, etc. to occur in the metal film. The Al electrode cannot be selectively etched when used together with other metals, such as Ti, ITO, Ta, and Mo, composing a TFT device, and is very easily etched if there is a defect in the insulator or other films formed thereon. Accordingly, the present liquid crystal display device is arranged in the aforementioned manner, as well as manufactured according to the method detailed below.

Now, a method of manufacturing a TFT array substrate included in the liquid crystal display device will be discussed in reference to FIG. 3 to FIG. 5.

Figure 3A:
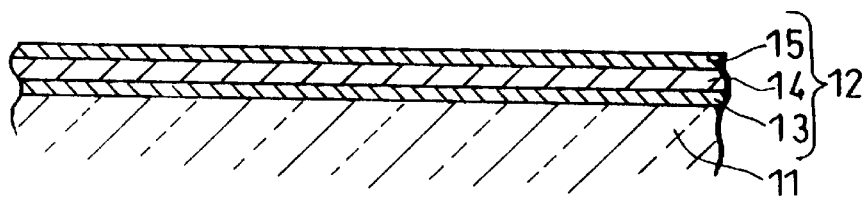
FIG. 3(a) is a vertical cross-sectional view showing a step of forming the gate electrode shown in FIG. 1.

First, as shown in FIG. 3(a), the three films, i.e., the Ti film 13, the 2000 Å thick Al film 14, and the TiN film 15, that constitute the three-layered gate electrode 12 are formed sequentially on the glass substrate 11 using a PVD technique (Physical Vapor Deposition technique, which is a sputtering technique) according to those film forming conditions stipulated in Table 1. In this process, a mixed gas of Ar and $N_2$ is used according to the gas flow stipulated in Table 1. The resistance (Ω/□) stipulated again in Table 1 refers to a surface resistance of the gate electrode 12.

Figure 6A:
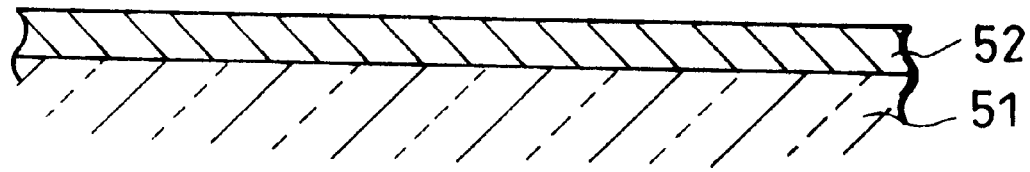
FIG. 6(a) is a vertical cross-sectional view showing a step of forming a gate electrode in a manufacturing process of a conventional TFT array substrate.
Figure 6B:
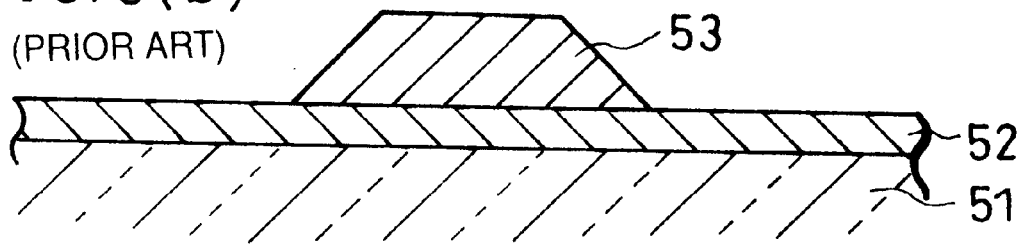
FIG. 6(b) is a vertical cross-sectional view showing a step of fabricating a resist into a predetermined electrode pattern as required by the foregoing gate electrode.

Next, similarly to the step shown in FIG. 6(b), a resist is deposited on the gate electrode 12 and fabricated into a predetermined electrode pattern for the gate electrode 12 (not shown) using a photolithography technique.

Figure 3B:
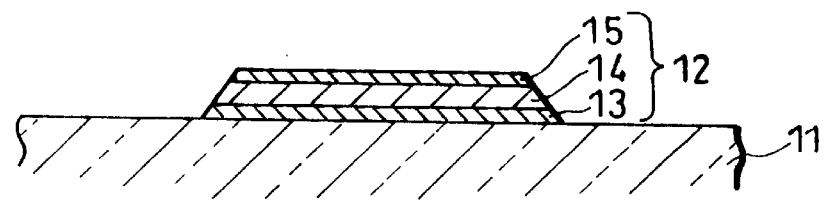
FIG. 3(b) is a vertical cross-sectional view showing a step of fabricating the foregoing gate electrode into a predetermined electrode pattern.
Figure 6C:
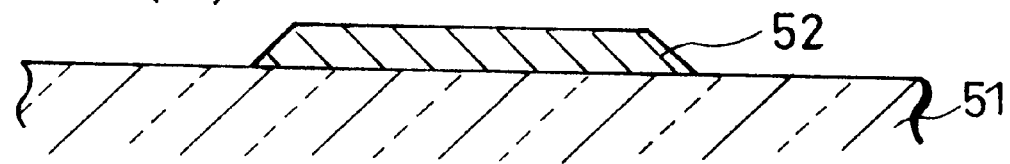
FIG. 6(c) is a vertical cross-sectional view showing a step fabricating the foregoing gate electrode into a predetermined electrode pattern.
Figure 6D:
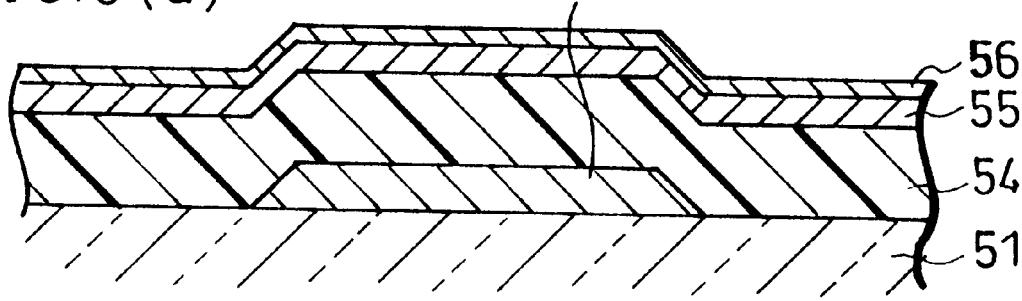
FIG. 6(d) is a vertical cross-sectional view showing a step of successively forming a gate insulator film, an I—Si film, and an n+ film.
Figure 7A:
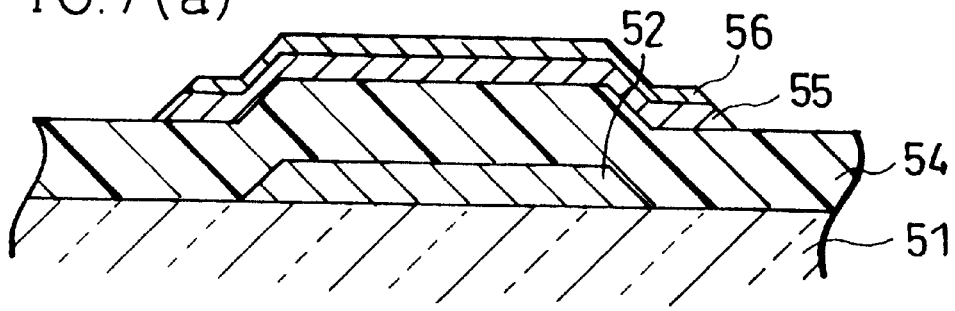
FIG. 7(a) is a vertical cross-sectional view showing a step, subsequent to the step shown in FIG. 6(d), of forming a semiconductor layer.
Figure 7B:
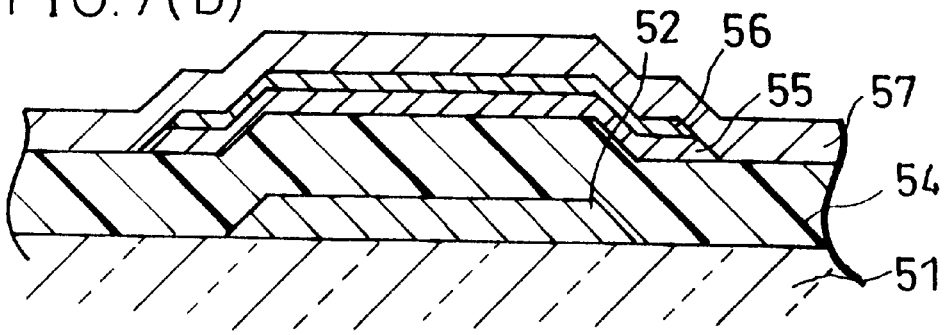
FIG. 7(b) is a vertical cross-sectional view showing a step of fabricating a source electrode into a predetermined electrode pattern.
Figure 7C:
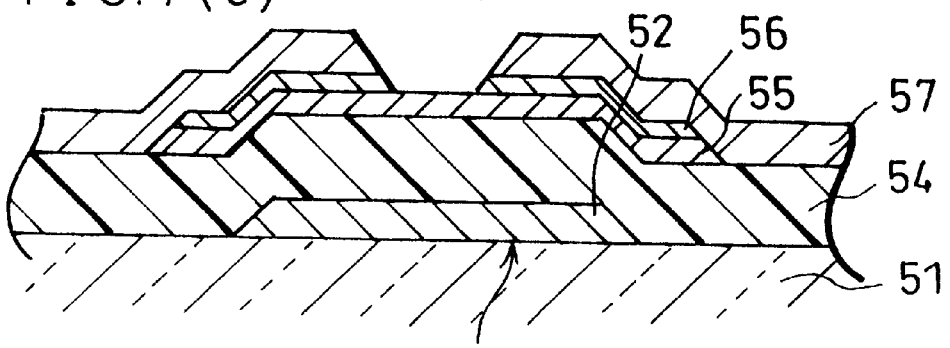
FIG. 7(c) is a vertical cross-sectional view showing a step of forming a TFT.
Figure 7D:
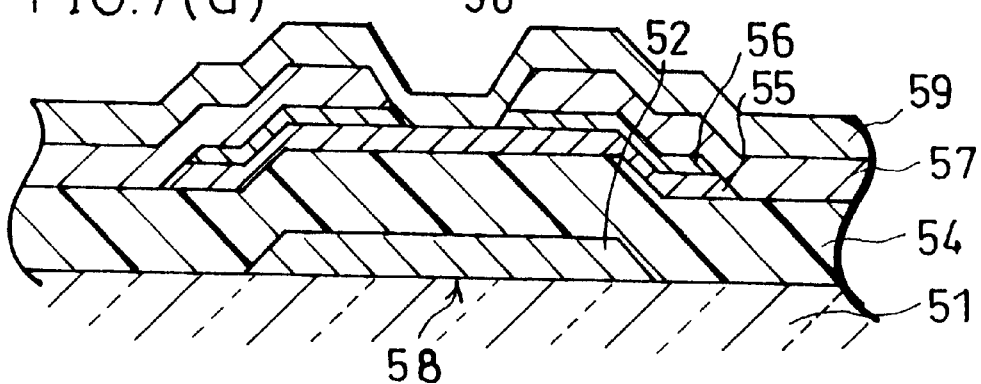
FIG. 7(d) is a vertical cross-sectional view showing a step of forming a pixel electrode.
Figure 8A:
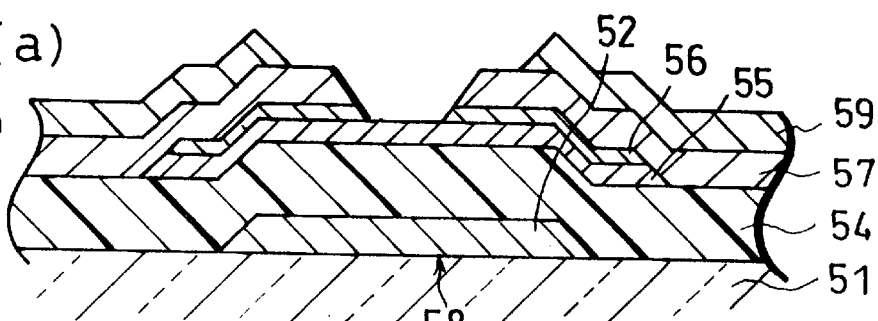
FIG. 8(a) is a vertical cross-sectional view showing a step, subsequent to the step shown in FIG. 7(d), of fabricating a pixel electrode into a predetermined electrode pattern.
Figure 8B:
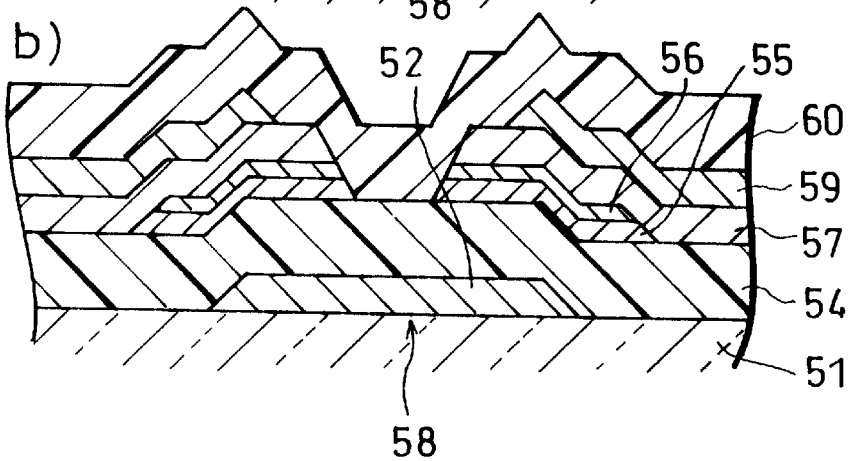
FIG. 8(b) is a vertical cross-sectional view showing a step of forming a TFT protection film.

Then, as shown in FIG. 3(b), similarly to the step shown in FIG. 6(c), the three films constituting the gate electrode 12 are etched all together using a dry etching technique, such as a PE (Plasma etching) technique or an RIE (Reactive Ion Etching) technique, to form the gate electrode 12 in a predetermined electrode pattern. The resist is then removed. The etching is performed according to those conditions stipulated in Table 2. Here, subsequent to the etching, a treatment step is executed according to those conditions stipulated in Table 3 so as to protect the Al film 14 from erosion, since $Cl_2$ is used as an etching gas. In the treatment step, residual chlorine ions are replaced with fluorine ions to protect the Al film 14 from erosion caused by HCl.

Figure 3C:
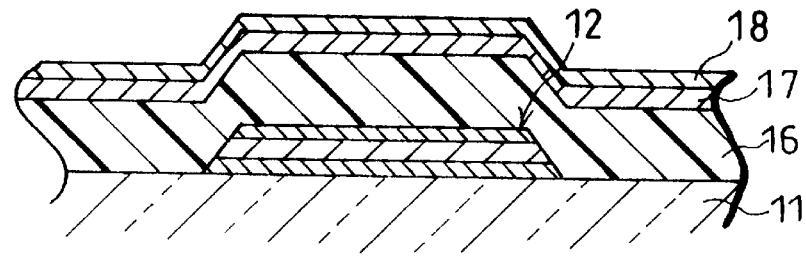
FIG. 3(c) is a vertical cross-sectional view showing steps of successively forming a gate insulator film, an I—Si film, and an n$^+$ film.

After forming the gate electrode 12, as shown in FIG. 3(c), the gate insulator film (typically an $SiN_x$ film) 16, the I—Si film 17, and the $n^+$ film 18 are successively formed using a PE-CVD technique.

Figure 3D:
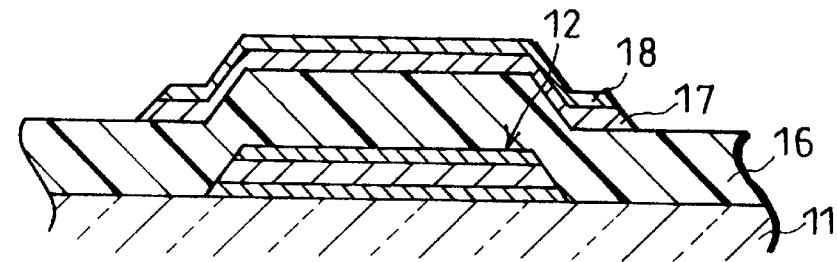
FIG. 3(d) is a vertical cross-sectional view showing a step of forming a channel section of a TFT.

Subsequently, as shown in FIG. 3(d), the I—Si film 17 and the $n^+$ film 18 are fabricated into an island-like shape to form a channel section of the TFT.

Thereafter, the covering of wiring of the terminal section for driving the liquid crystal display panel is removed; specifically, the covering of the Ti film 13 serving as the terminal section, the Al film 14, and the TiN film 15, i.e., the gate electrode 12 is removed (not shown) by subjecting the gate insulator film 16 to patterning. For this patterning, a resist is provided according to a pattern on the gate insulator film 16 which is then etched above the connecting terminal section of the gate electrode 12.

Figure 4A:
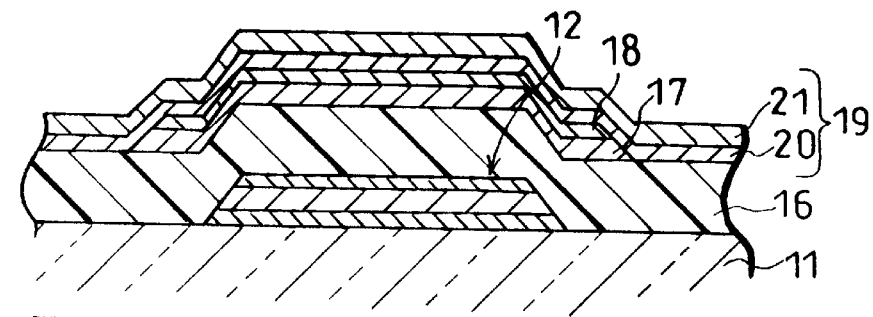
FIG. 4(a) is a vertical cross-sectional view showing a step, subsequent to the step shown in FIG. 3(d), of forming a source electrode.

Next, as shown in FIG. 4(a), the TiN film 20 and the 2000 Å thick Al film 21 are sequentially formed using a PVD technique as the double-layered source electrode 19. The thickness of the lower layer, that is, the TiN film 20, is set to 500 Å, which renders the TiN film 20 thick enough to serve as a barrier layer against liquid agents. The films are formed according to those conditions stipulated in Table 4.

Figure 4B:
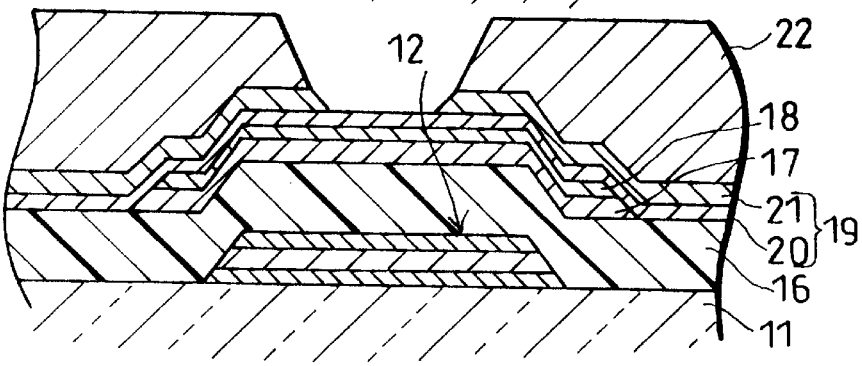
FIG. 4(b) is a vertical cross-sectional view showing a step of wet etching an Al film of a source electrode.

Next, similarly to the foregoing step of forming the gate electrode 12, a resist 22 is provided on the source electrode 19 and patterned for the source electrode 19. Thereafter, as shown in FIG. 4(b), the Al film 21 in the source electrode 19 is wet etched to remove its unnecessary parts. The Al film 14 in the gate electrode 12 below the source electrode 19 is protected by both the TiN film 20 in the source electrode 19 and the gate insulator film 16; a possible defect in either of the films therefore cannot be a cause for the etching liquid to reach the gate electrode 12. The gate electrode 12 is thus protected from erosion.

The terminal section of the gate electrode 12 is protected by covering the gate electrode 12 with the gate insulator film 16 and further with the source electrode 19 (see FIGS. 2(a) and 2(b)).

Figure 4C:
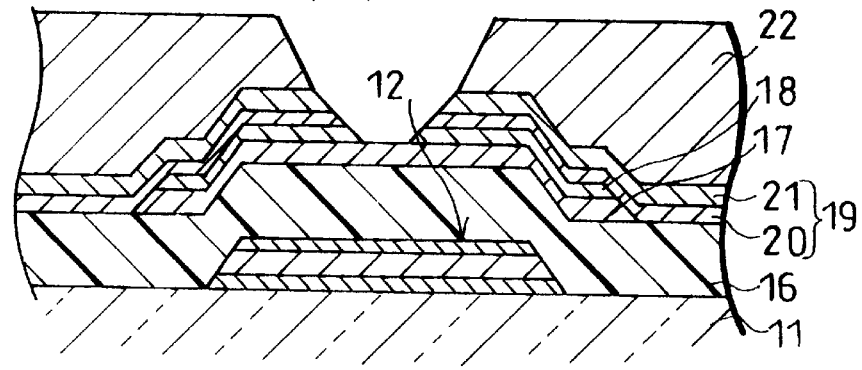
FIG. 4(c) is a vertical cross-sectional view showing a step of successively dry etching a TiN film of a source electrode and an n+ film of a channel section.

After etching the Al film 21 in the source electrode 19, as shown in FIG. 4(c), the TiN film 20, which is the lower layer of the source electrode 19, and the $n^+$ film 18 of the channel section are successively dry etched according to those conditions stipulated in Table 5, using the source mask used for the etching of the Al film 21, so as to concurrently form the source electrode 19 and the channel section of the TFT. Thereafter, the resist 22 is removed. Here, subsequent to the etching, a treatment step is executed according to those conditions stipulated in Table 6 so as to protect the Al film 21 from erosion caused by the etching.

Figure 4D:
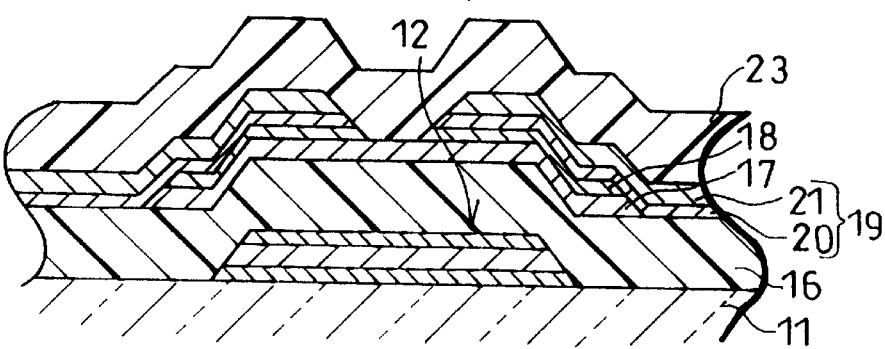
FIG. 4(d) is a vertical cross-sectional view showing a step of forming a TFT protection film.

Next, as shown in FIG. 4(d), the TFT protection film 23 is formed from a silicon nitride ($SiN_x$).

Figure 5A:
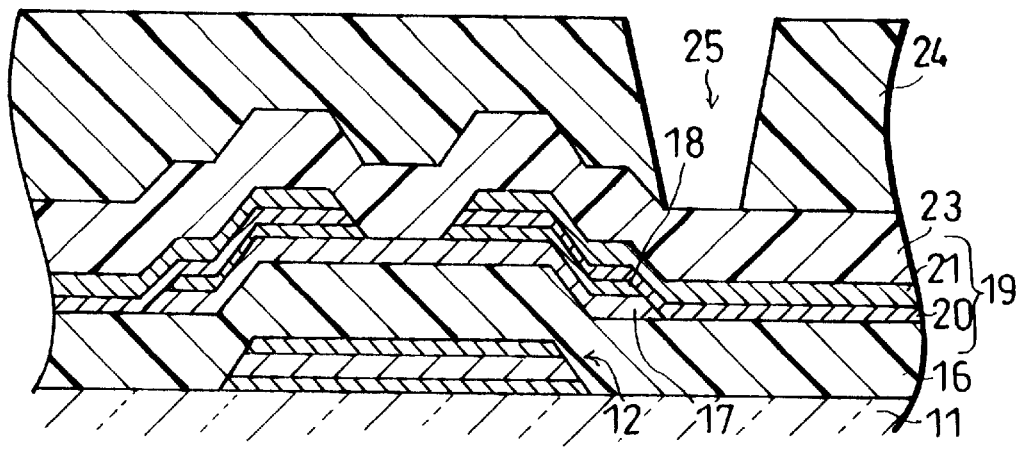
FIG. 5(a) is a vertical cross-sectional view showing a step, subsequent to the step shown in FIG. 4(d), of forming an organic insulating film as an interlayer insulating film.

Next, as shown in FIG. 5(a), the organic insulator film (interlayer insulator film) 24 is formed by applying an acrylic resin to the entire surface. The organic insulator film 24 is a second insulator film with the TFT protection film 23 being designated as a first insulator film. This forms a smooth top surface for the TFT array substrate. The thickness of the organic insulator film 24 is set to 3 μm to prevent a liquid agent from seeping during the etching of a later-mentioned ITO film (pixel electrode 26). A contact hole 25 is made through the organic insulator film 24 using a photolithography technique.

From the foregoing, in the liquid crystal display device of the present embodiment, the pixel electrode 26 is formed on at least the interlayer insulator films constituted by the TFT protection film (inorganic insulator film) 23 and the organic insulator film 24 that are formed in this sequence on the source electrode 19.

Therefore, for example, when the organic insulator film 24 is etched using a weak alkaline solution, the TFT protection film 23 that is an inorganic insulator film provides protection to the underlying source electrode 19 having an Al or Al alloy layer by preventing the etching liquid from reaching the source electrode 19. The source electrode 19 is thus protected from erosion.

Moreover, one less photo masks are required in the patterning of the foregoing two interlayer insulator layers, by using the same pattern in the patterning of the organic insulator film 24 (3 μm thick) in the photolithography step and in the following patterning of the inorganic insulator film (TFT protection film 23, 0.13 μm thick) by dry etching. The foregoing arrangement offers good selectivity that allows selective etching of the TFT protection film 23, while providing protection to the underlying source electrode 19 having an Al or Al alloy layer.

Further, the foregoing arrangement allows the pixel electrode 26 to be substantially separated by the interlayer insulator layers from the first electrode, for example, the source electrode 19 or the gate electrode 12. Therefore, the foregoing arrangement successfully protects the Al or Al alloy layer in the source electrode 19 from erosion during the etching of the pixel electrode 26 despite a possible defect in either of the interlayer insulator layers. Leakage can be also prevented between the pixel electrode 26 and the source electrode 19.

In the foregoing arrangement, the TFT protection film 23 is formed on the source electrode 19 (metal electrode) having the foregoing Al or Al alloy layer; therefore, the inorganic insulator film is formed with high quality, in comparison to a conventional arrangement including an inorganic insulator film formed on an organic insulator film. Further, the organic insulator film 24 can be formed on the inorganic insulator film (TFT protection film 23) in a satisfactory manner.

In other words, by forming the interlayer insulator films on the source electrode 19 in the sequence as set forth in the present invention (an organic insulator film over an inorganic insulator film), the interlayer insulator films are formed with satisfactory quality. This results in less defects occurring in the interlayer insulator films, successfully preventing the etching liquid from reaching the metal electrode through the defects and thus protecting the metal electrode from erosion during the patterning of the pixel electrode.

Figure 5B:
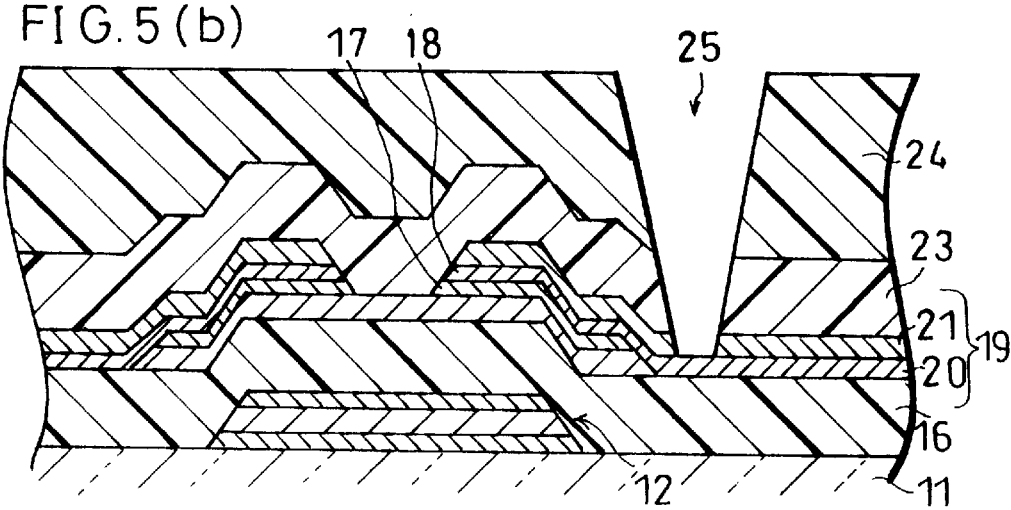
FIG. 5(b) is a vertical cross-sectional view showing a step of dry etching an Al film of a TFT protection film and a source electrode through a contact hole.

Next, as shown in FIG. 5(b), the silicon nitride TFT protection film 23 and the Al film 21 in the source electrode 19 are successively etched by dry etching through the contact hole 25. The Al film 21 is etched for the purpose of establishing ohmic contact between a later-mentioned pixel electrode 26 and the Al film 21.

Figure 5C:
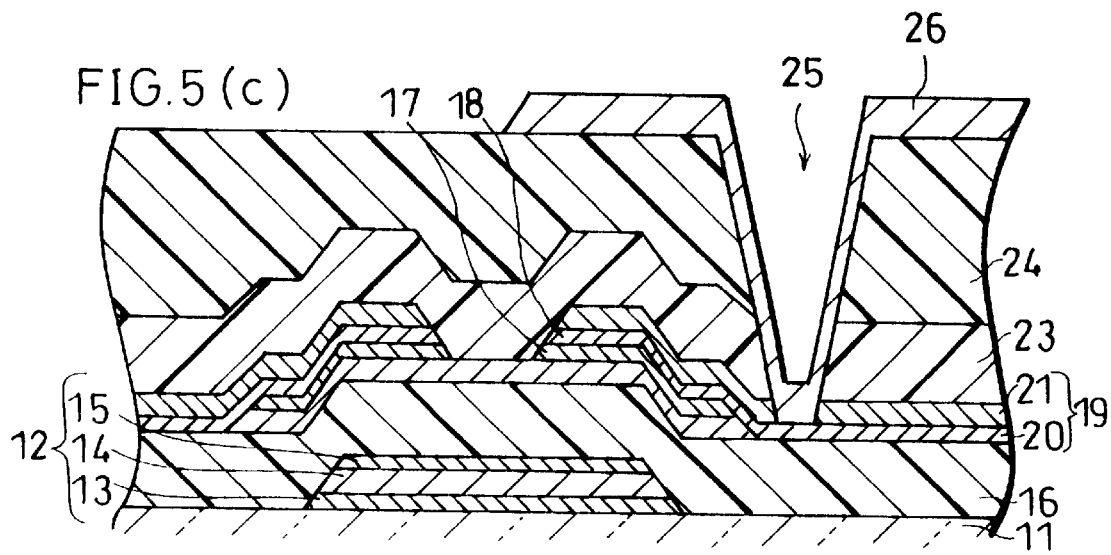
FIG. 5(c) is a vertical cross-sectional view showing a step of forming a pixel electrode.

Thereafter, as shown in FIG. 5(c), a pixel electrode 26 is fabricated from an ITO film using a sputtering technique. Then, a resist is deposited on the pixel electrode 26 and patterned for the pixel electrode 26. Thereafter the pixel electrode 26 is etched using, for example, HCl or HBr into a predetermined electrode pattern. The terminal section is formed as shown in FIGS. 2(a) and 2(b).

Table 7 shows the steps of forming the TFT array substrate of the present embodiment as detailed above, in comparison to those of the conventional TFT array substrate.

TABLE 1

Conditions for forming a gate electrode film (DC Magnetron Sputtering)

| | DC power (kw) | Pressure (Pa) | Gas Flow (sccm) Ar | Gas Flow (sccm) $N_2$ | Temperature (° C.) | Time (sec) | Thickness (Å) | Resistance ($\Omega/\square$) |
|---|---|---|---|---|---|---|---|---|
| Ti film | 5–15 | 0.5–1 | 50–100 | — | 100 | 40 | 300 | 0.25 |
| Al film | 10–20 | 0.5–1 | 50–100 | — | 100 | 80 | 2000 | |
| TiN film | 5–15 | 0.5–1 | 50–100 | 5–20 | 100 | 60 | 500 | |

TABLE 2

Conditions for etching a gate (Reactive Ion Etching)

| RF Power (kw) | Pressure (mT) | Gas Flow (sccm) $Cl_2$ | Gas Flow (sccm) Ar | Gas Flow (sccm) $BCl_3$ | Temperature (° C.) | Time (sec) |
|---|---|---|---|---|---|---|
| 2–4 | 5–20 | 100–300 | 0–100 | 0–100 | 60 | End Point Detected |

TABLE 3

Conditions for post-treatment of etched gate electrode

| RF Power (kw) | Pressure (mT) | Gas Flow (sccm) $CF_4$ | Gas Flow (sccm) $O_2$ | Temperature (° C.) | Time (sec) |
|---|---|---|---|---|---|
| 1–3 | 10–40 | 50–250 | 20–100 | 60 | 30–240 |

TABLE 4

Conditions for forming a source electrode film (DC Magnetron Sputtering)

| | DC power (kw) | Pressure (Pa) | Gas Flow (sccm) Ar | Gas Flow (sccm) $N_2$ | Temperature (° C.) | Time (sec) | Thickness (Å) | Resistance ($\Omega/\square$) |
|---|---|---|---|---|---|---|---|---|
| Ti or TiN film | 5–15 | 5–10 | 50–75 | 0–15 | 100 | 40 | 500 | 0.2 |
| Al film | 10–15 | 3–10 | 50–75 | — | 100 | 40 | 2000 | |

TABLE 5

Conditions for etching a source electrode and TFT channel section (Reactive Ion Etching)

| RF Power (kw) | Pressure (mT) | Gas Flow (sccm) $Cl_2$ | Gas Flow (sccm) $BCl_3$ | Temperature (° C.) | Time (sec) |
|---|---|---|---|---|---|
| 2–4 | 5–20 | 30–300 | 100–300 | 60 | End Point Detected |

TABLE 6

Conditions for post-treatment of etched source electrode

| RF Power (kw) | Pressure (mT) | Gas Flow (sccm) $CF_4$ | Gas Flow (sccm) $O_2$ | Temperature (° C.) | Time (sec) |
|---|---|---|---|---|---|
| 2–3 | 20–40 | 100–300 | 10–100 | 60 | 120 |

TABLE 7

| Process of the Present Invention | Conventional Process |
| --- | --- |
| Gate electrode (including Al film) formed | Gate electrode (including Ta film) formed |
| n$^+$/I-Si channel section formed. | n$^+$/I-Si channel section formed |
| Gate insulator film patterned | Gate insulator film patterned |
| (Terminal section exposed) | (Terminal section exposed) |
| Source electrode (including an al film) formed TiN film below an al film successively patterned using a source photo mask | Source electrode (including a Ta film) formed |
| TFT protection film and interlayer insulator film formed and patterned Contact hole section successively etched to form a contact hole | Pixel electrode (an ITO film) formed |
| Pixel electrode (ITO film) formed | TFT protection film formed |

As discussed so far, a liquid crystal display device in accordance with the present invention is characterized in that it includes:

a first electrode having an Al or Al alloy layer;

a pixel electrode provided above the first electrode; and at least two interlayer insulator layers interposed between the first electrode and the pixel electrode so as to cover the first electrode.

According to the arrangement, the pixel electrode, composed of an ITO film for example, is formed as, for example, the topmost layer above the two or more interlayer insulator layers. Note that one of the interlayer insulator layers may be replaced with a TFT protection film. The other layer may be, for example, an organic insulator layer (for example, 1 µm thick or thicker).

Accordingly, the arrangement enables the interlayer insulator layers to substantially separate the pixel electrode from the first electrode, for example, the source electrode or the gate electrode. Therefore, the arrangement successfully protects the Al or Al alloy layer in the first electrode from erosion during the etching of the pixel electrode despite a possible defect in either of the interlayer insulator layers.

Further, the separation of the pixel electrode from the first electrode, for example, the source electrode, prevents leakage between the pixel electrode and the first electrode.

A first method of manufacturing a liquid crystal display device in accordance with the present invention is characterized in that it includes the steps of:

providing a first electrode having an Al or Al alloy layer;

providing at least two interlayer insulator layers above the first electrode so as to cover the first electrode; and providing a pixel electrode above the interlayer insulator layers.

According to the arrangement, the pixel electrode, composed of an ITO film for example, is formed as, for example, the topmost layer above the two or more interlayer insulator layers. Note that one of the interlayer insulator layers may be replaced with a TFT protection film. The other layer may be, for example, an organic insulator layer (for example, 1 µm thick or thicker).

Accordingly, the arrangement enables the interlayer insulator layers to substantially separate the pixel electrode from the first electrode, for example, the source electrode or the gate electrode. Therefore, the arrangement successfully protects the Al or Al alloy layer in the first electrode from erosion during the etching of the pixel electrode despite a possible defect in either of the interlayer insulator layers.

Further, the separation of the pixel electrode from the first electrode, for example, the source electrode, prevents leakage between the pixel electrode and the first electrode.

Note that less photo masks are required in the photolithography step if all the interlayer insulator layers are concurrently etched after their formation.

A second method of manufacturing a liquid crystal display device in accordance with the present invention includes all the features of the foregoing first method of manufacturing and is characterized in that at least one of the two interlayer insulator layers is an inorganic insulator layer, and the other is an organic insulator layer.

The arrangement produces the same advantages as the first method of manufacturing. In addition, according to the arrangement, the interlayer insulator layers interposed between the pixel electrode and the first electrode are an inorganic insulator layer and an organic insulator layer; therefore, the inorganic insulator layer, which has a higher dielectric constant than an organic insulator layer and requires an extended time in formation and etching, does not need to be as thick as in a case where the interlayer insulator layers are wholly composed of an inorganic insulator layer. As a result, undesirable static capacity is prevented from occurring between the pixel electrode and the first electrode, and the interlayer insulator layers are prevented from taking an extended time in formation.

A third method of manufacturing in accordance with the present invention includes all the features of the foregoing second method of manufacturing and is characterized in that:

the first electrode serves as a source electrode;

a gate electrode having an Al or Al alloy layer is provided below the source electrode; and the inorganic insulator layer is a TFT protection film provided on the source electrode.

The arrangement produces the same advantages as the second method of manufacturing. In addition, according to the arrangement, the interlayer insulator layers protect the Al or Al alloy layers in the source electrode and the gate electrode from erosion. Further, the TFT protection film provided on the first electrode plays another role as an inorganic insulator film; this restrains increase in the number of interlayer insulator films, which otherwise would add to the complexity of the structure of the liquid crystal display device.

A fourth method of manufacturing a liquid crystal display device in accordance with the present invention includes all the features of the foregoing second method of manufacturing and is characterized in that:

the first electrode serves as a source electrode;

a gate electrode having an Al or Al alloy layer is provided below the source electrode;

the source electrode is provided by depositing at least a first source electrode layer and a second source electrode layer composed of Al or an Al alloy in this sequence when viewed from the gate electrode, and the first source electrode layer and the pixel electrode cover a terminal section, of the gate electrode, that serves as a connecting terminal.

The arrangement produces the same advantages as the second method of manufacturing. In addition, according to the arrangement, the first source electrode layer and the pixel electrode cover a terminal section, of the gate electrode, that serves as a connecting terminal. In such an event, if the wiring pattern for the pixel electrode is left so as to cover the whole terminal section for example, the part of the terminal section that is not covered with the gate insulator layer is covered with a pixel electrode. This ensures that the terminal section is provided with protection.

A fifth method of manufacturing a liquid crystal display device in accordance with the present invention is characterized in that:

a gate insulator layer is provided above a gate electrode having an Al or Al alloy layer;

a source electrode is provided by depositing at least a first source electrode layer and a second source electrode layer composed of an Al or Al alloy above the gate insulator layer, the first and second source electrode layers being provided in this sequence when viewed from the gate insulator layer; and the first source electrode layer is dry etched after the second source electrode layer is wet etched so as to fabricate the source electrode into a predetermined electrode pattern.

According to the arrangement, a source electrode is provided by depositing at least a first source electrode layer, for example, a TiN film, and a second source electrode layer composed of an Al or Al alloy above the gate insulator layer, the first and second electrode layers being provided in this sequence when viewed from the gate insulator layer, as well as the first source electrode layer is dry etched after the second source electrode layer is wet etched so as to fabricate the source electrode into a predetermined electrode pattern; therefore, the gate electrode is protected from erosion during etching of the source electrode. Note that the source resist film used in the wet etching may be used during the dry etching without modification.

In other words, if the second source electrode layer composed of Al or an Al alloy and first source electrode layer composed of, for example, a TiN film, the layers constituting the source electrode, are successively wet etched, the Al or Al alloy layer in the gate electrode possibly erodes due to a defect in the gate insulator layer, such as a pin hole.

Accordingly, the second source electrode layer, which is an upper layer composed of Al or an Al alloy, is wet etched followed by dry etching of the first source electrode layer, which is a lower layer. In such an event, the first source electrode layer, as well as the gate insulator film, serves as a barrier layer during the wet etching, and ensures that the gate electrode is protected from erosion.

Note that if a gas, such as $CF_4$, which can selectively etch Al, is used, the gate electrode is surely protected despite a possible defect in the gate insulator layer.

Besides, even if a $Cl_2$ gas, which can not selectively etch Al, is used, supposing that anisotropic etching is employed, the gate electrode is not severely damaged, and can be recovered by a TFT protection film.

Further, it may be conceivable to concurrently dry etch the second source electrode layer and the first source electrode layer; however, to concurrently performing the etching of the source electrode into a pattern and the etching of the $n^+$ film in a gap of the TFT, uniformity is required in the etching to ensure TFT properties (remaining amount of the I—Si film). In such an event, by providing a thin source electrode by wet etching, the absolute value of the distribution of the etching rate can be reduced. Uniformity is thus ensured in TFT properties.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A liquid crystal display device, comprising:
   a first electrode including an Al or Al alloy layer;
   a pixel electrode provided above the first electrode, and
   at least two interlayer insulator layers interposed between the first electrode and the pixel electrode so as to cover the first electrode,
   wherein the two interlayer insulator layers include a first interlayer insulator layer comprising an inorganic insulator film and a second interlayer insulator layer comprising an organic insulator film, the first and second interlayer insulator layers being provided in this sequence with no other layer at any point therebetween when viewed from the first electrode, so that the second interlayer insulator layer is formed directly on the first interlayer insulator layer,
   wherein the first electrode serves as a source electrode,
   a gate electrode including an Al or Al alloy layer provided below the source electrode,
   the source electrode including at least a first source electrode layer comprising at least one of TiN, Ta, Ti, Cr, Mo, and MoN, and a second source electrode layer comprising said Al or Al alloy layer of said first electrode, the first and second source electrode layers being provided in sequence, and
   wherein the first source electrode layer and the pixel electrode are provided so as to cover a terminal section of the gate electrode that serves as a connecting terminal outside of a pixel area of the display device.

2. The liquid crystal display device as set forth in claim 1, wherein the first interlayer insulator layer comprising an inorganic insulator film is provided directly on the first electrode.

3. The liquid crystal display device as set forth in claim 1, wherein the inorganic insulator film of the first interlayer insulator layer is a TFT protection film provided on the source electrode.

4. The liquid crystal display device as set forth in claim 3, wherein
   the gate electrode has a three-layered structure including a Ti film, an Al film, and a TiN film.

5. The liquid crystal display device as set forth in claim 3, wherein the TFT protection film comprises $SiN_x$ or $SiO_2$.

6. The liquid crystal display device as set forth in claim 1, wherein the organic insulator film comprises an acrylic resin.

7. The liquid crystal display device of claim 1, wherein a contact hole is formed in a gate insulator over the gate electrode in the terminal section outside the pixel area of the display device, and wherein the first source electrode layer contacts the gate electrode in the terminal section through the contact hole formed in the gate insulator.

8. A method of manufacturing a liquid crystal display device, the method comprising:

providing a first electrode including an Al or Al alloy layer;

depositing at least a first layer comprising an inorganic insulator film and a second layer comprising an organic insulator film above the first electrode so as to provide at least two interlayer insulator layers that at least partially cover the first electrode, the first and second layers being provided in this sequence when viewed from the first electrode, and the second layer being formed directly on the first layer so that no other layer is provided at any point between the first and second layers;

providing a pixel electrode above the first and second interlayer insulator layers;

wherein the first electrode serves as a source electrode, a gate electrode including an Al or Al alloy layer provided below the source electrode, the source electrode including at least a first source electrode layer comprising at least one of TiN, Ta, Ti, Cr, Mo, and MoN, and a second source electrode layer comprising said Al or Al alloy layer of said first electrode, the first and second source electrode layers being provided in sequence, and wherein the first electrode layer and the pixel electrode are provided so as to cover a terminal section of the gate electrode that serves as a connecting terminal outside of a display area of the display device.

9. The method of manufacturing a liquid crystal display device as set forth in claim 8, wherein the first layer comprising an inorganic insulator film is provided directly on the first electrode.

10. The method of manufacturing a liquid crystal display device as set forth in claim 9, wherein the inorganic insulator film of the first layer is a TFT protection film provided on the source electrode.

11. The method of claim 8, wherein a contact hole is formed in a gate insulator over the gate electrode in the terminal section outside the display area of the display device, and wherein the first source electrode layer contacts the gate electrode in the terminal section through the contact hole formed in the gate insulator.

12. A liquid crystal display device, comprising:

a first electrode including an Al or Al alloy layer;

a pixel electrode provided above the first electrode, and at least two interlayer insulator layers interposed between the first electrode and the pixel electrode so as to cover the first electrode, wherein the two interlayer insulator layers include a first interlayer insulator layer comprising an inorganic insulator film and a second interlayer insulator layer comprising an organic insulator film, the first and second interlayer insulator layers being provided in this sequence with no other layer at any point therebetween when viewed from the first electrode, so that the second interlayer insulator layer is formed directly on the first interlayer insulator layer, wherein the first electrode serves as a source electrode, a gate electrode including an Al or Al alloy layer provided below the source electrode, the source electrode including at least a first source electrode layer comprising at least one of TiN, Ta, Ti, Cr, Mo, and MoN, and a second source electrode layer comprising said Al or Al alloy layer of said first electrode, the first and second source electrode layers being provided in sequence, wherein the first source electrode layer and the pixel electrode are provided so as to at least partially cover a terminal section of the gate electrode that serves as a connecting terminal, and wherein in a contact hole in at least one of the interlayer insulators where the source electrode is connected to the pixel electrode, the first source electrode layer, which is exposed because of removal of the second source electrode layer, is connected to the pixel electrode.

13. A liquid crystal display device, comprising:

at least two interlayer insulator layers interposed between a source electrode portion and a pixel electrode, wherein the two interlayer insulator layers include a first interlayer insulator layer comprising an inorganic insulator film and a second interlayer insulator layer comprising an organic insulator film, the first and second interlayer insulator layers being provided in this sequence with no other layer at any point therebetween when viewed from the first electrode, so that the second interlayer insulator layer is formed directly on the first interlayer insulator layer, a gate electrode at least partially covered by a gate insulator, the source electrode including at least a first source electrode layer and a second source electrode layer of different materials;

wherein a contact hole is defined in the gate insulator over at least a portion of the gate electrode; and wherein the first source electrode layer and the pixel electrode are provided so as to at least partially extend into the contact hole defined in the gate insulator over the portion of the gate electrode so that at least the first source electrode layer contacts an exposed part of the gate electrode through the contact hole.

14. The display device of claim 13, wherein the contact hole in the gate insulator is provided in a terminal section of the display outside of a display area.

15. A liquid crystal display device, comprising:

at least two interlayer insulator layers interposed between a source electrode portion and a pixel electrode, wherein the two interlayer insulator layers include a first interlayer insulator layer comprising an inorganic insulator film and a second interlayer insulator layer comprising an organic insulator film, the first and second interlayer insulator layers being provided in this sequence with no other layer at any point therebetween when viewed from the first electrode, so that the second interlayer insulator layer is formed directly on the first interlayer insulator layer, a gate electrode at least partially covered by a gate insulator, the source electrode including at least a first source electrode layer and a second source electrode layer of different materials; and wherein in a contact hole in at least one of the interlayer insulators where the source electrode is connected to the pixel electrode, the first source electrode layer, which is exposed because of removal of the second source electrode layer, is connected to the pixel electrode.

* * * * *